(12) United States Patent
Harada

(10) Patent No.: US 6,624,469 B1
(45) Date of Patent: Sep. 23, 2003

(54) VERTICAL MOS TRANSISTOR HAVING BODY REGION FORMED BY INCLINED ION IMPLANTATION

(75) Inventor: Hirofumi Harada, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/690,226

(22) Filed: Oct. 17, 2000

(30) Foreign Application Priority Data

Oct. 18, 1999 (JP) ............................................ 11-295838
Oct. 13, 2000 (JP) ........................................ 2000-313770

(51) Int. Cl.$^7$ ......................... H01L 29/76; H01L 29/94; H01L 31/062; H01L 31/113; H01L 31/119
(52) U.S. Cl. ...................... 257/330; 257/329; 257/331; 257/339; 257/341
(58) Field of Search ................................. 257/329, 330, 257/331, 339, 341

(56) References Cited

U.S. PATENT DOCUMENTS 4,503,449 A * 3/1985 David et al. ................. 257/330
5,877,527 A * 3/1999 Okabe et al. ................ 257/330
6,452,228 B1 * 9/2002 Okuno et al. ................ 257/330

* cited by examiner

Primary Examiner—Steven Loke
(74) Attorney, Agent, or Firm—Adams & Wilks

(57) ABSTRACT

There is provided a vertical MOS transistor in which a high frequency characteristic is improved, a low voltage operation is realized, and a stable characteristic with less fluctuation is obtained. After trench gate oxidation, a body is formed at a side wall by inclined ion implantation, and after formation of a gate electrode, a low concentration source region is formed by inclined ion implantation, so that a capacitance between a gate and a source and a capacitance between a gate and a drain are suppressed. When the above body region formation method is used, an impurity distribution between the drain and the source of a channel region also becomes uniform. Besides, since a channel length is determined by an etching apparatus, by using the same apparatus for trench-etching and for etching of the gate electrode, a stable channel length can be obtained.

10 Claims, 5 Drawing Sheets

VERTICAL MOS TRANSISTOR HAVING BODY REGION FORMED BY INCLINED ION IMPLANTATION

BACKGROUND OF THE INVENTION

1. Field of the Invention

The present invention relates to a vertical MOS transistor having a trench structure.

2. Description of the Related Art

As a discrete power transistor, in recent years, instead of a bipolar transistor, a MOS transistor in which driving power has been improved and the cost has been reduced, comes to be used. Since this power MOS transistor has such a structure that current is made to flow in the direction vertical to a substrate, this is called a vertical MOS transistor, and is frequently used for a case where a large current of, for example, an ampere class is controlled, as an external driver of an IC in a case where a low power consumption and low ON resistance are needed, or the like. In particular, a vertical trench DMOS transistor using a trench structure as shown in FIG. 3 has a merit that a cell pitch is made minute without increasing a parasitic resistance as compared with a conventional planar type vertical DMOS transistor. FIG. 2 is a planar type vertical DMOS comprising an N– epitaxial layer 2 on an N+ substrate 1, gate oxide on the surface of the N– epitaxial layer 2 and a gate electrode 5 on the N– layer 2, and has a double diffused drain structure.

Then the vertical trench DMOS has been the mainstream as a structure capable of obtaining a small size, low cost, and low ON resistance.

The structure of FIG. 3 having the trench structure is an example of an N-channel MOS. This structure is formed in such a manner that a semiconductor substrate in which a low concentration N-type layer 2 is epitaxially grown on a high concentration N-type substrate 1 which becomes a drain region, is prepared, a P-type diffusion region 20 called a body region is formed from the surface of this semiconductor substrate by impurity implantation and high temperature heat treatment at 1000° C. or more, and a high concentration N-type impurity region 21 which becomes a source region and a high concentration P-type impurity region 22 for fixing the potential of the body region by ohmic contact are formed from the surface.

For the purpose of making the high concentration N-type impurity region 21 which becomes the source region have the same potential as the high concentration P-type impurity region 22 in FIG. 3, a contact layout is adopted, and although not shown, contact of both the regions is made by one contact hole. Then, single crystal silicon is etched through the P-type diffusion region 20 and the high concentration N-type source region 21 to form a silicon trench 23, and a gate oxide film 4 and a gate electrode 5 made of polycrystalline silicon are embedded in this silicon trench 23.

By the structure as described above, this structure can be made to function as a vertical MOS transistor in which a current flowing from the rear side high concentration N-type drain region 1 and the low concentration N-type drain region 2 to the surface side high concentration N-type source region 21 is controlled by the gate electrode 5 embedded in the trench 23 through the gate oxide film 4 at the side wall of the trench. A P-channel MOS can be formed by inverting the conductivity type of the diffusion of FIG. 3.

The structure and manufacturing method of such a vertical MOS transistor are disclosed in, for example, U.S. Pat. No. 4,767,722.

However, in the structure and manufacturing method of such a vertical MOS transistor, there exist problems as follows:

First, the relation between the depth of the trench 23 and the depth of the P-type diffusion region 20 which becomes the body region has a very important influence on the characteristics of the vertical MOS transistor. For example, if the depth of the P-type diffusion region 20 which becomes the body region is deep as compared with the depth of the trench 23, even if the body region adjacent to the gate oxide film 4 is inverted by the gate electrode 4, the P-type diffusion region 20 which is not inverted and becomes the P-type body region exists between the inverted channel region and the N-type low concentration drain region 2, so that a current can not be made to flow between the drain and the source. In the case where the depth of the trench 23 is excessively deeper than the P-type diffusion region 20 which becomes the body region, although this structure can be made to operate as a transistor, an area where the N-type low concentration drain region 2 overlaps with the gate electrode 5 through the gate oxide film 4 becomes large, and the gate-drain capacitance becomes large by this. This capacitance impedes a high frequency operation. Here, although the P-type diffusion region 20 which becomes the body region is formed by diffusing an implanted impurity through the high temperature heat treatment, since fluctuation in a high temperature heat treatment condition is low, fluctuation in the diffusion length is low.

On the other hand, in silicon etching for forming the trench 23, since there is no indicator used for stopping the etching to a desired etching depth, the etching depth is controlled through a time. However, in an anisotropic dry etching apparatus used here, since an etching rate is fluctuated by changes in apparatus temperature, gas flow rate and distribution, and the like, the total amount of etching, that is, the trench depth is apt to fluctuate. Then, normally, in order to make it possible that the transistor operation can be made even if the depth of the trench 23 becomes shallow because of fluctuation, the amount of etching is set to a valve rather larger than a target value. Thus, the foregoing gate-drain capacitance is redundantly added, and there occurs a limit in the improvement of high frequency operation.

Second, after polycrystalline silicon which becomes the gate electrode 5 is embedded in the trench 23 by CVD, in order to remove other polycrystalline silicon on the surface of the semiconductor substrate except for the polycrystalline silicon in the trench, etch-back of the polycrystalline silicon is carried out. However, if the amount of etch-back is excessively large, the polycrystalline silicon in the trench is slightly etched, and an overlap portion between the polycrystalline silicon region which becomes the gate electrode 5 and the N-type high concentration region 21 disappears, so that a threshold voltage is greatly increased, or in the worst case, the transistor operation is lost.

The etching end time of this polycrystalline silicon is determined by detecting a difference in light emission in plasma when the under layer is exposed as a result of etching of the polycrystalline silicon on the surface of the substrate or by detecting a radical amount in an etching gas, and by adjusting an over etching amount from that. With respect to the etching amount of the polycrystalline silicon at this time, by using the foregoing detecting method, as compared with the silicon etching for forming the trench 23, although the fluctuation among wafers and lots can be lessened, wafer in-plane fluctuation can not be suppressed. Then, considering that the N-type high concentration source region 21 overlaps with the polycrystalline silicon which becomes the gate electrode 5 to perform the transistor operation even at a place where the etching amount is largest on the wafer surface, the over etching amount of the polycrystalline silicon is determined. Thus, on the wafer surface, there occurs fluctuation in the amount of the overlap between the N-type high concentration source region 21 and the polycrystalline silicon which becomes the gate electrode 5. A sample in which the overlap amount between the gate and source is large has a large capacitance between the gate and source, so that a trouble is still caused in the high frequency operation.

Third, since the P-type diffusion region 20 which becomes the body region is formed by ion implantation from the principal surface of the N-type epitaxial layer 2 and by the high temperature heat treatment, there is obtained such an impurity profile that the side of the N-type high concentration region 21 has the highest concentration, and the concentration of a portion becomes low as the portion approaches the drain. However, due to the diffusion fluctuation of the N-type high concentration region 21 and the implantation depth fluctuation of the P-type diffusion region 20, the peak concentration here is apt to fluctuate, and the threshold voltage is apt to fluctuate by this.

SUMMARY OF THE INVENTION

In order to solve the above problems, according to a first aspect of the present invention, a vertical MOS transistor includes a semiconductor substrate including a high concentration layer of a first conductivity type and an epitaxial layer on the high concentration layer, the epitaxial layer having the first conductivity type and a concentration lower than that of the high concentration layer; a recess portion formed from a principal surface of the semiconductor substrate toward the high concentration layer of the first conductivity type to have such a depth that it does not reach the high concentration layer of the first conductivity type; an insulating film covering a side face and a bottom face of the inside of the recess portion; a gate electrode made of polycrystalline silicon which is in contact with the insulating film and is embedded in the recess portion; a source region of the first conductivity type formed outside of the recess portion to be in contact with the recess portion and on the surface of the semiconductor substrate; a body region of a second conductivity type which is formed to be in contact with the recess portion and to surround the high concentration source region and is formed to a same depth as a bottom portion of the recess portion; and a drain electrode connected to the high concentration region of the first conductivity type of a rear face of the semiconductor substrate.

Besides, the vertical MOS transistor is characterized in that in the body region, an impurity concentration distribution in a depth direction from the source region to the epitaxial layer of the first conductivity type is constant.

Besides, the vertical MOS transistor is characterized in that a planar width of a region of the body region which is in contact with the recess portion and extends from the source region to the epitaxial layer of the first conductivity type is 0.5 μm or less.

Besides, the vertical MOS transistor includes a gate electrode made of polycrystalline silicon being in contact with the insulating film and embedded to a halfway depth in the recess; a high concentration source region of the first conductivity type which is formed outside of the recess portion and is formed on the principal surface of the semiconductor substrate to be in contact with the recess portion and not to have an overlap portion with the polycrystalline silicon through the insulating film; and a low concentration source region of the first conductivity type which is formed to be in contact with the recess portion, is formed from a bottom of the high concentration source region to an upper end of the polycrystalline silicon, and has a concentration lower than the high concentration source region.

According to another aspect of the present invention, a vertical MOS transistor includes a semiconductor substrate including a high concentration layer of a first conductivity type and an epitaxial layer on the high concentration layer, the epitaxial layer having the first conductivity type and a concentration lower than that of the high concentration layer; a recess portion formed from a principal surface of the semiconductor substrate toward the high concentration layer of the first conductivity type to have such a depth that it does not reach the high concentration layer of the first conductivity type; an insulating film covering a side face and a bottom face of the inside of the recess portion; a gate electrode made of polycrystalline silicon which is in contact with the insulating film and is embedded to a halfway depth in the recess portion; a high concentration source region of the first conductivity type which is formed outside of the recess portion and is formed on the principal surface of the semiconductor substrate to be in contact with the recess portion and not to have an overlap portion with the polycrystalline silicon through the insulating film; a low concentration source region of the first conductivity type which is formed to be in contact with the recess portion, is formed from a bottom of the high concentration source region to an upper end of the polycrystalline silicon, and has a concentration lower than the high concentration source region; a body region of a second conductivity type which is formed to be in contact with the recess portion and to surround the high concentration source region and the low concentration source region; and a drain electrode connected to the high concentration region of the first conductivity type of a rear face of the semiconductor substrate.

Besides, the vertical MOS transistor is characterized in that the polycrystalline silicon in the recess portion is embedded to a depth of 0.5 to 0.8 μm from the principal surface of the semiconductor substrate.

Besides, the vertical MOS transistor is characterized in that an overlap between the low concentration source region of the first conductivity type and the polycrystalline silicon through the insulating film in a depth direction is 0.1 μm or less.

Besides, the vertical MOS transistor is characterized in that the concentration of the low concentration region of the first conductivity type is from $55 \times 10^{17}/cm^3$ to $4 \times 10^{18}/cm^3$, and the concentration of the body region of the second conductivity type is $2 \times 10^{16}/cm^3$ to $5 \times 10^{17}/cm^3$.

According to still another aspect of the present invention, a method of manufacturing a vertical MOS transistor includes the steps of forming an oxide film on a principal surface of a semiconductor substrate of a first conductivity type; depositing polycrystalline silicon on the oxide film; exposing the principal surface of the semiconductor substrate by patterning the polycrystalline silicon and the oxide film; forming a trench by etching the exposed semiconductor substrate together with the polycrystalline silicon by an anisotropic dry etching method; forming a gate insulating film on the inside of the trench; forming a body region of a second conductivity type by an ion implantation method at an irradiation angle varied according to a trench depth and a trench width; embedding polycrystalline silicon in the trench; forming a gate electrode in the trench by carrying out etch-back of the polycrystalline silicon; forming a low concentration source region of the first conductivity type by an ion implantation method at an inclined irradiation angle of 30° or more with respect to a vertical direction; and forming a high concentration source region of the first conductivity type by an ion implantation method at an inclined irradiation angle of 7° or less with respect to the vertical direction.

Besides, the method of manufacturing the vertical MOS transistor is characterized in that a laminate film forming planar patterning of the trench is an oxide film and a silicon nitride film in sequence from the principal surface of the semiconductor substrate.

Besides, the method of manufacturing the vertical MOS transistor is characterized in that a laminate film forming planar patterning of the trench is an oxide film and a photoresist in sequence from the principal surface of the semiconductor substrate.

Besides, the method of manufacturing the vertical MOS transistor is characterized in that an etching apparatus for forming the trench is made a same apparatus as an etching apparatus for carrying out etch-back of the polycrystalline silicon to form the gate electrode.

DETAILED DESCRIPTION OF THE PREFERRED EMBODIMENTS

Embodiments of the present invention will be described below with reference to the drawings.

Figure 1:
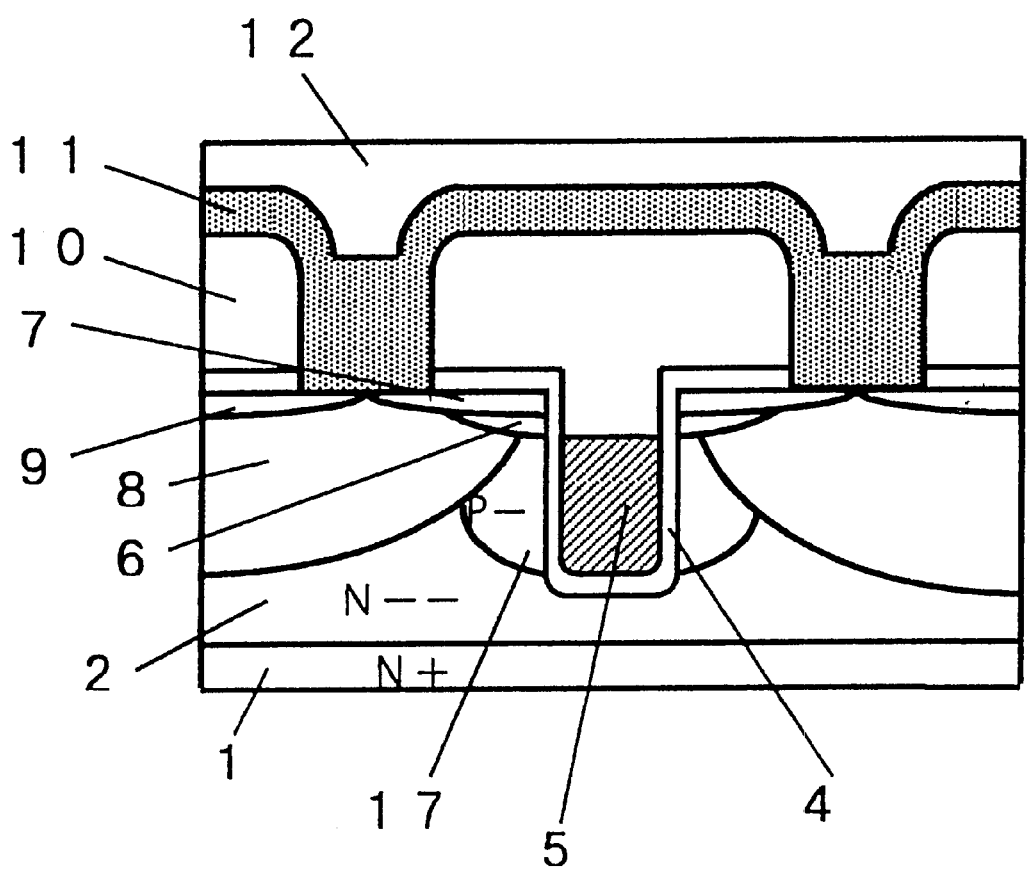
FIG. 1 is a schematic sectional view of a vertical MOS transistor of the present invention.
Figure 2:
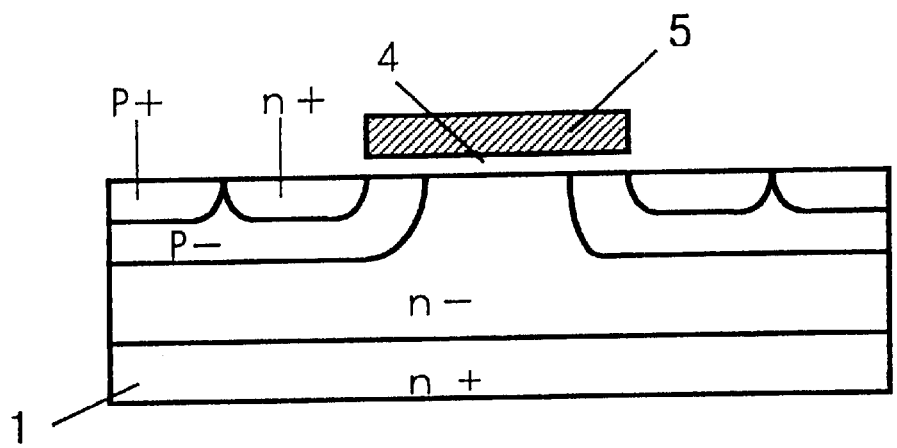
FIG. 2 is a schematic sectional view of a conventional vertical MOS transistor.
Figure 3:
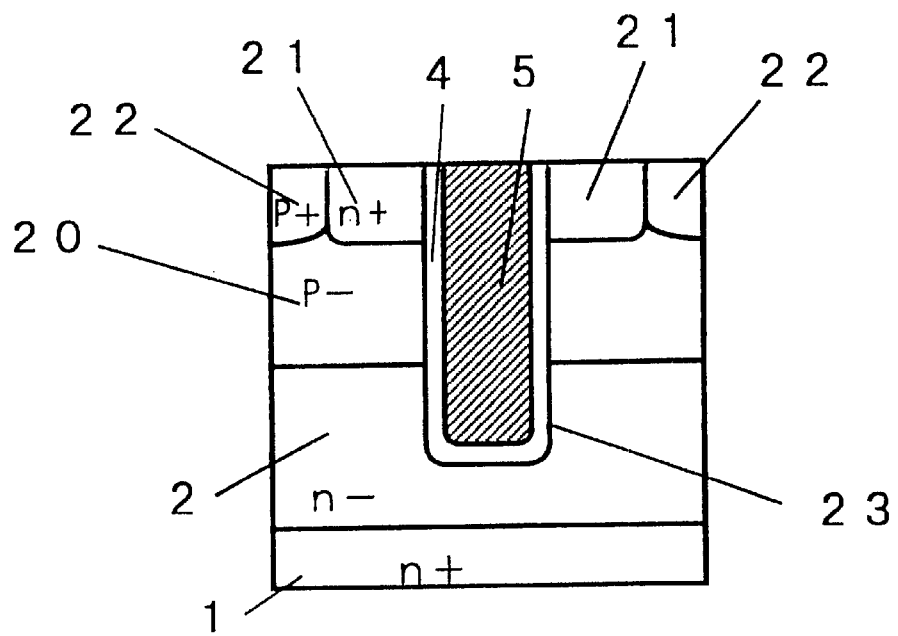
FIG. 3 is a schematic sectional view of a conventional vertical MOS transistor including a trench structure.

FIG. 1 is a sectional view of a principal portion of an N-channel vertical MOS transistor of an embodiment of the present invention. N−− epitaxial layer 2 is formed on N+ substrate 1, trench structure gate electrode 5 which is covered with gate oxide 4 is formed in the N−− epitaxial layer 2, and body P− region 17 is formed around the gate oxide. N+ source region 7 in contact with side surfaces of the gate oxide 4 and P− diffused region 9 adjacent to the N+ source region 7 are formed in the surface of the N−− epitaxial layer 2. Further, P-type body region 17 is formed around the gate oxide 4 and N-source region 6 is formed between the N+ source region 7 and P type body region 17. P+ diffused region 8 is formed under P+ contact region 9 and N+ source region 7. Further, insulation film 10, metal electrodes 11 which are connected to the P+ body contact region 9 and the N+ source region 7, and a passivation film 12 are formed on the gate oxide 4.

Figure 4A:
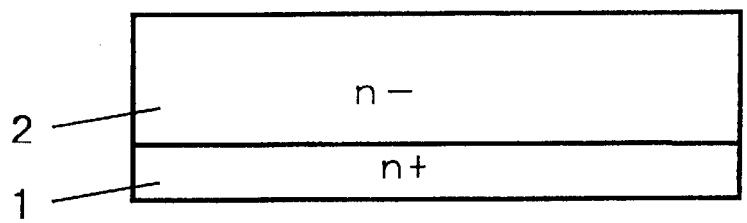
FIGS. 4A to 4D are schematic process sectional views showing a method of manufacturing a vertical MOS transistor of the present invention.

For the purpose of clarifying the features of the present invention, a description will be made on the basis of a method of manufacturing an N-channel vertical MOS transistor of the present invention as shown in FIGS. 4A to 4D. First, there is prepared a semiconductor substrate of plane orientation 100 including an N-type high concentration substrate 1 doped with As or Sb to have a resistivity of 0.001 Ω·cm to 0.01 Ω·cm, and an N-type low concentration epitaxial layer 2 on the N-type high concentration substrate, which is doped with P or a concentration of $2\times10^{14}/cm^3$ to $4\times10^{16}/cm^3$ and has a thickness of from several µm to several tens µm (FIG. 4A). The thickness of the N-type epitaxial layer is changed according to a required withstand voltage between a drain and a source.

Figure 4B:
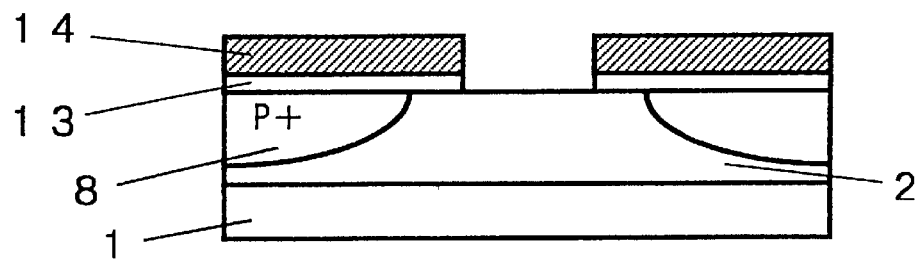

Next, B is implanted into a region, which subsequently becomes a body of this vertical MOS transistor and does not become a channel, to make the region to have a high concentration, and thereafter, a heat treatment is carried out so that a P-type high concentration diffusion region 8 having a concentration of $1\times10^{18}/cm^3$ to $4\times10^{19}/cm^3$ and a depth of several µm to ten and several µm is formed. By forming this region, it is possible to obtain an affect to suppress a vertical direction parasitic NPN bipolar operation and vertical direction punch through. Although not shown, LOCOS is formed in a region other than an active region, and thereafter, in order to form a silicon trench in the active region, single crystal silicon of a portion where the trench is to be formed is exposed (FIG. 4B). At this time, as a mask member used for etching the single crystal silicon, a thermal oxide film or a CVD oxide film 13 or 100 Å to 2000 Å is deposited on the single crystal silicon, and in the present invention, a polycrystalline silicon 14 containing no impurity is deposited thereon by the CVD.

Figure 4C:
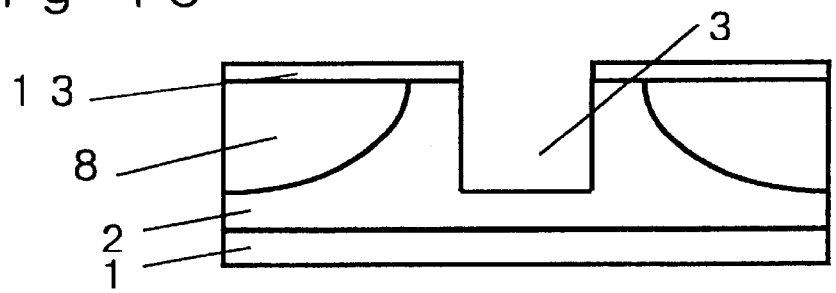

Trench etching is carried out from this state by an anisotropic etching method such as RIE. At this time, silicon of the N-type low concentration region 2 is etched, so that the trench 3 is formed and at the same time, the polycrystalline silicon film 14 on the oxide film 13 is also etched (FIG. 4C). Here, when it is assumed that an etching rate of the polycrystalline silicon film 14 is the same as an etching rate of the single crystal silicon, if the CVD deposition film thickness of the polycrystalline silicon film 14 is set to the same thickness as the etching depth of the single crystal silicon, at the same time as the completion of desired depth etching of the single crystal silicon, etching of the polycrystalline silicon film 14 is also completed. This etching end time can be known from the detection of plasma light emission of the oxide film 13 under the polycrystalline silicon film 14, the detection of the change of a radical amount in an etching gas, or the like.

In general, the etching rate of the polycrystalline silicon film 14 is 1.2 to 2.4 times the etching rate of the single crystal silicon, though it depends on the film quality of the polycrystalline silicon, and apparatus and etching conditions. Thus, when the deposition film thickness of the polycrystalline silicon film 14 is set larger than the etching amount of the single crystal silicon in view of the difference between the etching rates, a desired trench depth can be stably obtained with less fluctuation.

Even if the film thickness of the polycrystalline silicon film 14 is not made coincident with the equivalent etching depth of the single crystal silicon, a desired trench depth can be obtained by performing a predetermined amount of over etching from an etching time of the polycrystalline silicon film 14. That is, even if thick film polycrystalline silicon which becomes an excessive load to a CVD apparatus is not deposited, the silicon trench 3 of a stable depth can be obtained.

In this embodiment, the polycrystalline silicon film 14 is deposited on the oxide film 13, and it is made an indicator of an etch stop of single crystal silicon. However, instead of the polycrystalline silicon film 14, if a film, such as a photoresist or silicon nitride film, has a stable etching rate under a condition through anisotropic etching by RIE, it can also be used as an indicator of an etch stop of single crystal silicon.

Next, a trench corner portion 18 is rounded by a well-known method such as high temperature sacrificial oxidation or isotropic dry etching, and then, a gate oxide film 4 is formed on a side wall and a bottom face of the trench.

Figure 4D:
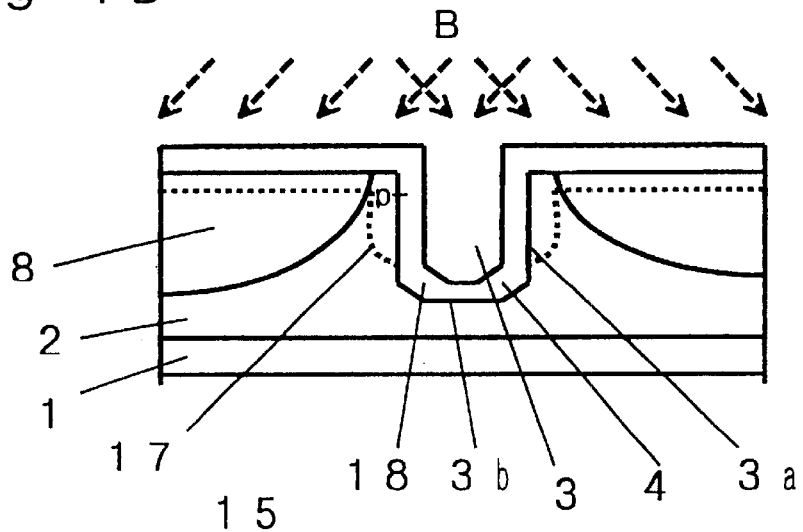

Thereafter, impurity implantation for forming a body region peculiar to the present invention is carried out. First, in this impurity implantation, ion implantation of a P-type impurity such as B is carried out at an intentionally inclined irradiation angle with respect to the vertical direction, so that the impurity enters a region, which becomes a channel, through a side wall 3a of the gate oxide film 4 in the trench 3 and does not enter a region 3b which becomes a low concentration drain of the bottom face (FIG. 4D). The irradiation angle at this time is determined according to the planar width and depth of the trench 3. For example, in the case of a width of 1 μm and a depth of 2 μm, implantation is made at an inclination angle of 30° or more with respect to the vertical direction. Desirably, in view of extension of diffusion by a subsequent high temperature heat treatment, the angle is suitably determined within the range of 35° to 45°. The implantation energy is selected in view of the thickness of the gate oxidation film and the inclination angle such that the impurity is sufficiently implanted into silicon of the trench side wall 3a.

Thereafter, this B is diffused by the high temperature heat treatment. The diffusion at this time is carried out in a nitrogen atmosphere at 1000° C. or more to such a degree that B implanted in the trench side wall 3a comes in contact with the P-type high concentration diffusion region 8 formed in the previous step. The amount of impurity implantation is adjusted so that the B concentration of a body region 17 (channel region 15) of the trench side wall 3a finally becomes $2\times10^{16}$/cm$^3$ to $5\times10^{17}$/cm$^{13}$. When this method is used, all of the trench side wall can be made a channel region without any margin, and it becomes unnecessary to form a deep trench to have a margin to a channel region to a certain degree in view of fluctuation in the trench depth like a conventional method. As a result, a gate-drain overlap capacitance can be made lower than that of the conventional method. Besides, by the method of the present invention, B is uniformly distributed in the channel region 15 of the trench side wall in the direction from the source to drain.

Figure 5A:
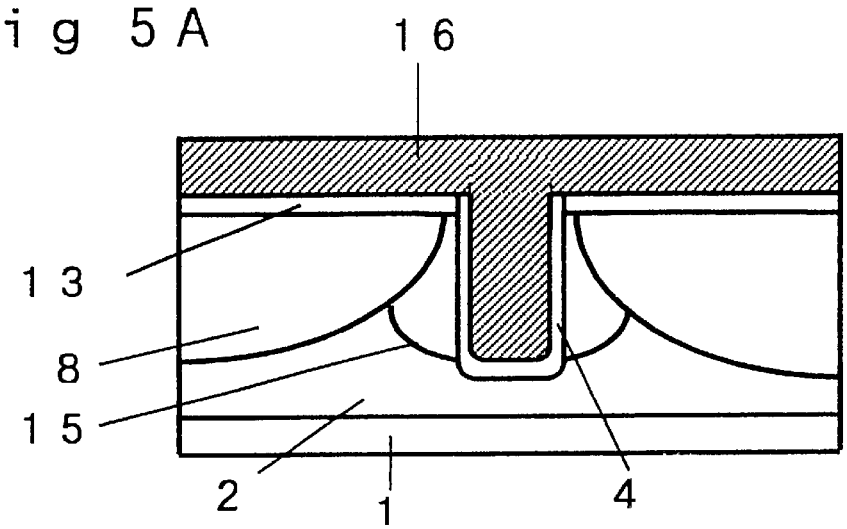
FIGS. 5A to 5C are schematic process sectional views showing the method of manufacturing the vertical MOS transistor of the present invention.

Next, a polycrystalline silicon film 16 is deposited by CVD, while the film thickness is selected in view of the trench width so that the inside of the trench is sufficiently filled, and an impurity, for example, P is implanted in the polycrystalline silicon film 16 by a heat diffusion method to have a high concentration of $1\times10^{20}$/cm$^3$ or more (FIG. 5A).

Next, with an etch-back method, this polycrystalline silicon film 16 is etched by the RIE apparatus used for the formation of the trench. Although an etching end time can be detected through the plasma light emission of the under oxide film 13 of the polycrystalline silicon film 16 or the change of the radical amount in the etching gas, in the present invention, over etching after the detection is made large, and the polycrystalline silicon film 16 is etched in the trench to a depth of 0.5 μm to 0.8 μm from the surface of the semiconductor substrate. At this time, the polycrystalline silicon film made to remain in the trench becomes a gate electrode 5 of the vertical MOS transistor of the present invention.

Figure 5B:
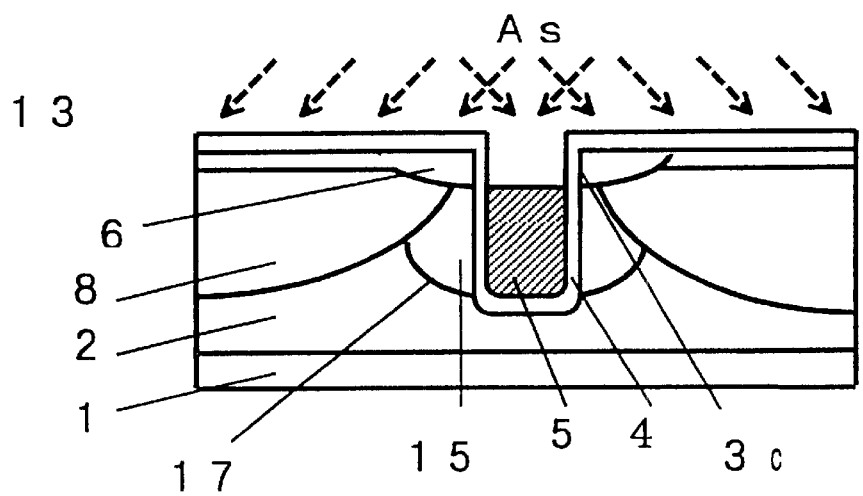

Thereafter, an N-type impurity such as P or As is ion implanted at an intentionally inclined irradiation angle with respect to the vertical direction to have a surface concentration of $5\times10^{17}$/cm$^3$ to $4\times10^{18}$/cm$^3$ so that it becomes a relatively low concentration with respect to a subsequently formed high concentration source region. Desirably, this inclination angle is increased up to a limit angle of the apparatus, such as 30° to 60°, with respect to the vertical direction. By doing so, a trench side wall of an upper portion 3c of the trench side wall not overlapping with the polycrystalline silicon can be made to have an N type (FIG. 5B).

By taking such a method, the channel length of the vertical MOS transistor of the present invention is determined as a distance between the trench bottom portion and a low concentration N-type region 6 of the upper portion of the trench side wall. That is, the conventional channel length is determined by the difference of the diffusion amounts in the depth direction at the double diffusion formation of the body region and the source region, while in the present invention, it is controlled by the dry etching amount of the trench, polycrystalline silicon, and the like.

In the conventional method, this low concentration N-type region 6 is not provided, and as a source region, only the N-type high concentration region exits, and the upper portion of polycrystalline silicon in the trench, which becomes the gate electrode, has almost the same position as the surface of the semiconductor substrate. In this case, in order to prevent an overlap between the high concentration source region and the polycrystalline silicon from disappearing by the over etching of the polycrystalline silicon or its fluctuation, an overlap of 0.2 μm to 0.4 μm is intentionally formed. This functions as the capacitance between the gate and source and impedes the high frequency operation.

In the present invention, even if the etching amount of the polycrystalline silicon film 16 is changed, since the low concentration N-type impurity region 6 is always formed to coincide with the position of the upper face of the polycrystalline silicon film 16 in the trench, the gate electrode is not separated from the low concentration N-type region 6. Besides, the ion implantation angle for formation of the low concentration N-type impurity region 6 is a high angle, and the impurity concentration is lower than that of a subsequent formed N-type high concentration source region, so that it is possible to suppress an overlap of the gate and the source immediately after the ion implantation or by a subsequent heat treatment process to 0.1 μm or less. Thus, the capacitance between the gate and the source can be suppressed to be small, and the high frequency characteristic can be improved as compared with the prior art.

Besides, since the single crystal silicon etching apparatus for formation of the trench is made the same as the polycrystalline silicon etching apparatus for gate electrode formation, even if wafer in-plane fluctuation exists in the amount of etching by this apparatus, since this fluctuation is cancelled out in the difference between the trench depth determined as the channel length and the depth of the upper end of the gate electrode, the wafer in-plane fluctuation of the channel length can be suppressed.

Figure 5C:
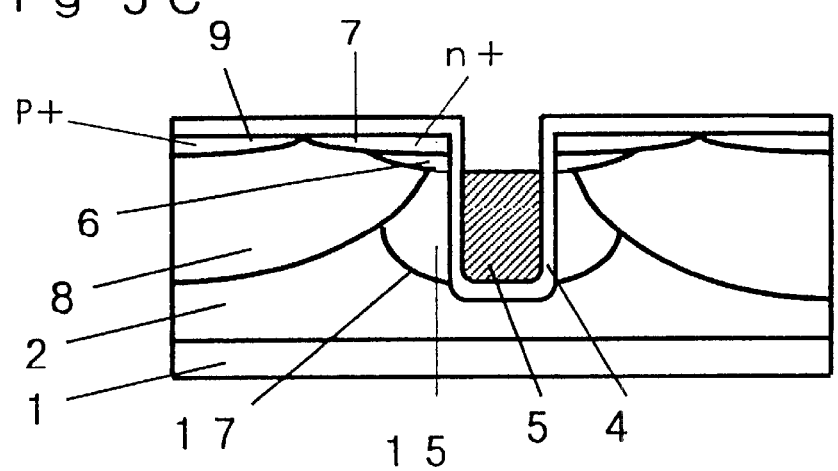

Thereafter, similarly to the conventional MOS process, for the purpose of forming a source region, as an N-type impurity, As is mainly implanted at an inclined irradiation angle of 7° to 1° with respect to the vertical direction and at a high concentration of $1\times10^{20}$/cm$^3$ or more. In the present invention, the depth of a high concentration N+ region 7 in the N-type epitaxial layer 2 does not reach the depth of the upper face of the polycrystalline silicon which becomes the gate electrode 5. Next, a P-type impurity for making ohmic contact with low resistance from the body region 17, for example, $BF_2$ is implanted at an inclined irradiation angle of 7° or less with respect to the vertical direction and at a high concentration of $1\times10^{20}/cm^3$ to form a P-type high concentration body contact region 9 (FIG. 5C). However, if the ohmic contact can be obtained in the P-type high concentration diffusion region 8 formed in FIG. 4B and its resistance is sufficiently low, this step may be deleted.

Although subsequent steps are not shown, similarly to the conventional semiconductor process, the main part of the vertical MOS transistor is completed through formation of an intermediate insulating film 10, formation of contact holes, formation of a metal electrode 11, formation of a protective film 12 and its patterning, and the sectional structure of the present invention becomes finally as shown in FIG. 1. As described above, the features of the present invention are as follows:

First, since the overlap amount of the polycrystalline silicon and the N-type low concentration region is small, the capacitance between the gate and the source is lower than that by the conventional method. Besides, since the ion implantation of the body region is carried out in the trench by the inclined implantation in accordance with the trench depth, the capacitance between the gate and the drain is also lower than that of the conventional method. By this, the operation can be made up to a frequency region higher than the prior art.

Second, in the body region formation method of the present invention, since the impurity concentration distribution of the region which becomes the channel in the body region becomes constant from the source region to the drain region, control of the threshold voltage by the amount of ion implantation for the body region formation is easy. Besides, the threshold voltage is not influenced by process fluctuation in the etching amount of the polycrystalline silicon film in the trench which becomes the gate, the amount of high concentration impurity diffusion of the source, or the like.

Third, although the channel length is determined by the trench depth and the etching amount of the polycrystalline silicon used for the gate electrode, since it is determined on the basis of the plasma light emission time of the oxide film of the etching mask, the radical amount change time in the etching gas, or the like, the channel length can be controlled with high accuracy. Further, trench etching and etching of polycrystalline silicon used for the gate electrode are carried out in the same apparatus, so that in-plane fluctuation in etching can be cancelled out, and therefore, wafer in-plane fluctuation of the channel length is also low.

Figure 6:
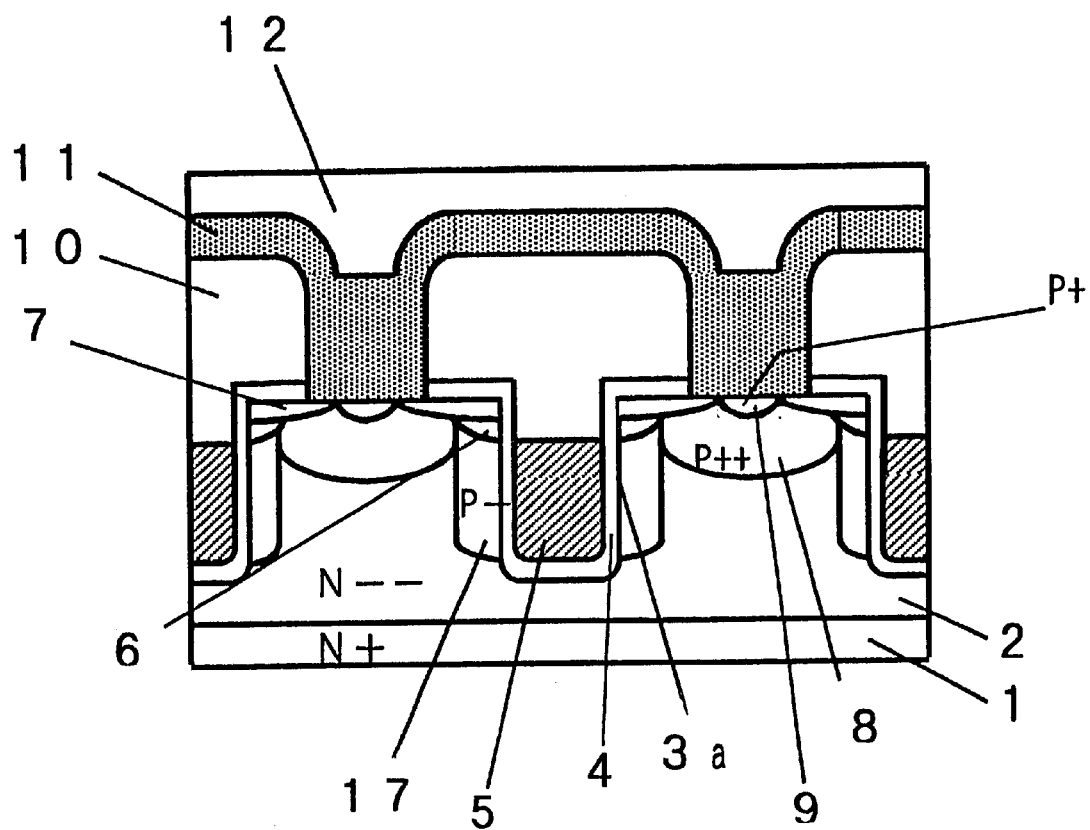
FIG. 6 is a schematic sectional view of a vertical MOS transistor of another embodiment of the present invention.

Another embodiment of the present invention as shown in FIG. 6 is more effective. Here, a P-type high concentration diffusion region 9 is shallowly formed from the principal surface of an N-type epitaxial layer 2, and a P-type body region 17 is also shallowly formed from a gate oxide film side wall 3a. It is desirable that the width of the P-type body region in the planar division is 0.5 μm or less from the gate oxide film side wall 3a. When such a structure is adopted, a depletion layer formed at the boundary between the N-type epitaxial layer and the P-type body region comes in contact with a depletion layer in the P-type body region just under the gate, so that a body capacitance under the gate electrode is reduced, and the subthreshold characteristic is improved. Thus, a lower voltage operation than the prior art becomes possible.

As described above, according to the present invention, for the body region and source region, by adopting the manufacturing method for performing impurity formation through the inclined ion implantation, the parasitic capacitance of the vertical MOS transistor can be reduced, and the high frequency characteristic can be improved.

Besides, for the purpose of improving the concentration profile of a channel, by adopting the manufacturing method for performing impurity formation through the inclined ion implantation, the control property of the threshold voltage is improved, and the stable characteristic with less fluctuation can be obtained.

Besides, by shallowly forming the body region, the subthreshold characteristic can be improved, and the low voltage operation becomes possible.

Besides, by adopting the manufacturing method in which a material having a stable etching rate is used together in the mask for trench formation, and an apparatus for trench formation is also used as an apparatus for etching polycrystalline silicon, process fluctuation can be reduced.

What is claimed is:

1. A vertical MOS transistor comprising:
   a semiconductor substrate including a high impurity concentration layer of a first conductivity type and an epitaxial layer disposed on the high impurity concentration layer, the epitaxial layer having the first conductivity type and an impurity concentration lower than that of the high impurity concentration layer;
   a trench formed in a principal surface of the epitaxial layer to extend into the epitaxial layer toward the high impurity concentration layer of the first conductivity type but not reaching the high impurity concentration layer of the first conductivity type;
   an insulating film covering a side face and a bottom face of an inside surface of the trench;
   a gate electrode made of polycrystalline silicon formed on the insulating film in the trench and having an upper surface below the principal surface of the epitaxial layer;
   a high impurity concentration source region of the first conductivity type formed outside of the trench in the principal surface of the epitaxial layer in contact with the trench and above the polycrystalline silicon gate electrode;
   a low impurity concentration source region of the first conductivity type formed in contact with the trench and extending from a bottom of the high impurity concentration source region to at least the upper surface of the polycrystalline silicon gate electrode, and having an impurity concentration lower than that of the high impurity concentration source region; and
   a body region of a second conductivity type formed in the epitaxial layer to be in contact with the trench and to surround the high impurity concentration source region and the low impurity concentration source region, and being formed by inclined ion implantation through the inside of the trench prior to formation of the gate electrode.

2. A vertical MOS transistor according to claim 1; wherein the body region serves as a channel region, and an impurity concentration distribution in a channel length direction, which is a depth direction of the epitaxial layer, is constant from the source region to the epitaxial layer of the first conductivity type.

3. A vertical MOS transistor according to claim 1; wherein a planar width of a portion of the body region which is in contact with the trench and extends from the source region to the epitaxial layer of the first conductivity type is 0.5 μm or less.

4. A vertical MOS transistor according to claim 1; wherein an upper surface of the polycrystalline silicon gate electrode in the trench is 0.5 to 0.8 μm below the principal surface of the epitaxial layer.

5. A vertical MOS transistor according to claim 1; wherein an overlap between the low impurity concentration source region of the first conductivity type and the polycrystalline silicon in the depth direction of the epitaxial layer is 0.1 μm or less.

6. A vertical MOS transistor according to claim 5; wherein an impurity concentration of the low impurity concentration source region of the first conductivity type is in the range of $5 \times 10^{17}/cm^3$ to $4 \times 10^{18}/cm^3$, and an impurity concentration of the body region of the second conductivity type is in the range of $2 \times 10^{16}/cm^3$ to $5 \times 10^{17}/cm^3$.

7. A vertical MOS transistor according to claim 1; wherein an impurity concentration of the low impurity concentration source region of the first conductivity type is in the range of $5 \times 10^{17}/cm^3$ to $4 \times 10^{18}/cm^3$, and an impurity concentration the body region of the second conductivity type is in the range of $2 \times 10^{16}/cm^3$ to $5 \times 10^{17}/cm^3$.

8. A vertical MOS transistor according to claim 1; wherein the body region surrounds the high and low impurity concentration source regions and has a bottom surface near a bottom surface of the polycrystalline silicon gate electrode.

9. A vertical MOS transistor according to claim 1; further comprising a drain electrode connected to the semiconductor substrate.

10. A vertical MOS transistor according to claim 1; wherein the trench is formed in a U shape.

* * * * *